United States Patent [19]
Canale et al.

[11] Patent Number: 6,040,213
[45] Date of Patent: Mar. 21, 2000

[54] POLYSILICON MINI SPACER FOR TRENCH BURIED STRAP FORMATION

[75] Inventors: Anthony J. Canale, Essex Junction; John E. Cronin, Milton, both of Vt.

[73] Assignee: International Business Machines Corporation, Armonk, N.Y.

[21] Appl. No.: 09/008,873

[22] Filed: Jan. 20, 1998

[51] Int. Cl.$^7$ .............................................. H01L 21/8242
[52] U.S. Cl. .............................................. 438/243; 438/246
[58] Field of Search ................................. 438/246, 389, 438/386, 243

[56] References Cited

U.S. PATENT DOCUMENTS

| | | | |
|---|---|---|---|
| 5,111,259 | 5/1992 | Teng et al. ............................ | 357/23.6 |
| 5,156,992 | 10/1992 | Teng et al. ............................ | 437/52 |
| 5,521,115 | 5/1996 | Park et al. ............................ | 437/60 |

*Primary Examiner*—Joni Chang
*Attorney, Agent, or Firm*—Ratner & Prestia; Eugene I. Shkurko

[57] ABSTRACT

A method for forming a semiconductor trench capacitor cell having a buried strap uses a substrate having a trench with a conductor separated from walls of the trench by a dielectric material. A portion of the dielectric material to a level below a top surface of the conductor is removed and at least a portion of the space thus formed is filled with a diffusible material. The buried strap is formed by annealing the conductor, the wall and the diffusible material so that conductive elements from the wall and the conductor diffuse into the diffusible material.

11 Claims, 8 Drawing Sheets

POLYSILICON MINI SPACER FOR TRENCH BURIED STRAP FORMATION

FIELD OF THE INVENTION

This invention relates to integrated circuit dynamic random access memories (DRAMs). More particularly, the invention relates to a method for forming a semiconductor trench capacitor cell having a buried strap.

BACKGROUND OF THE INVENTION

Due to the extensive use and broad range of applications for integrated circuits, a wide variety of semiconductor memory devices have been developed. Many memory devices, such as dynamic random access memory cells (DRAM cells), use a dynamic memory cell in which a bit is represented by a charge stored in a capacitor structure.

The size of the individual cell is an important consideration in the production of DRAMs. To save space on the surface of the chip, a deep trench capacitor may be used to form the device. Once the capacitor layout has been selected, the capacitor must be coupled with the storage node of its access transistor by a conductive strap. However, due to the high density of semiconductor devices, little room is available on the surface of the chip for the conductive strap.

Therefore, a buried conductive strap is often used to connect the capacitor and its access transistor. Because the strap is buried, there is more room on the surface of the semiconductor chip. This facilitates production of higher device densities, producing more densely packed memory arrays with greater storage capacity. Further, because the contacts of the buried strap are formed early in the integrated process (i.e, prior to formation of many surface structures), the possibility of damage to later-formed surface structures during strap formation is eliminated.

The method for forming the buried strap is key to the economical production of DRAMs. Therefore, there is a continuing need for processes for forming buried strap comprising semiconductor devices that use fewer processing sequences and produce these devices at a reduced cost.

SUMMARY OF THE INVENTION

The invention is a method for forming a semiconductor trench capacitor cell having a buried strap. The method comprises the steps of:
(a) providing a substrate comprising a trench having a conductor separated from walls of the trench by a dielectric material;
(b) removing a portion of the dielectric material to a level below a top surface of the conductor;
(c) filling at least a portion of a space formed by the removing of the dielectric material with a diffusible material; and
(d) forming a conductive pathway from a wall of the trench to the conductor including annealing the conductor, the wall and the diffusible material so that conductive elements from the wall and the conductor diffuse into the diffusible material.

In an alternate embodiment of the invention, a spacer is formed on the wall of the trench exposed by removing the dielectric material. The spacer protects the corner of the substrate during subsequent processing steps. In another embodiment, the wall exposed by removing the dielectric material is implanted with a dopant. The dopant can be diffused into the diffusible material by annealing.

The method reduces the number of process steps required to insure that a buried strap is formed. In addition, the method can be readily incorporated into the process for forming integrated circuits.

BRIEF DESCRIPTION OF THE DRAWINGS

The invention can be more fully understood from the following description in connection with the accompanying drawings described as follows.

DETAILED DESCRIPTION OF THE INVENTION

Figure 1:
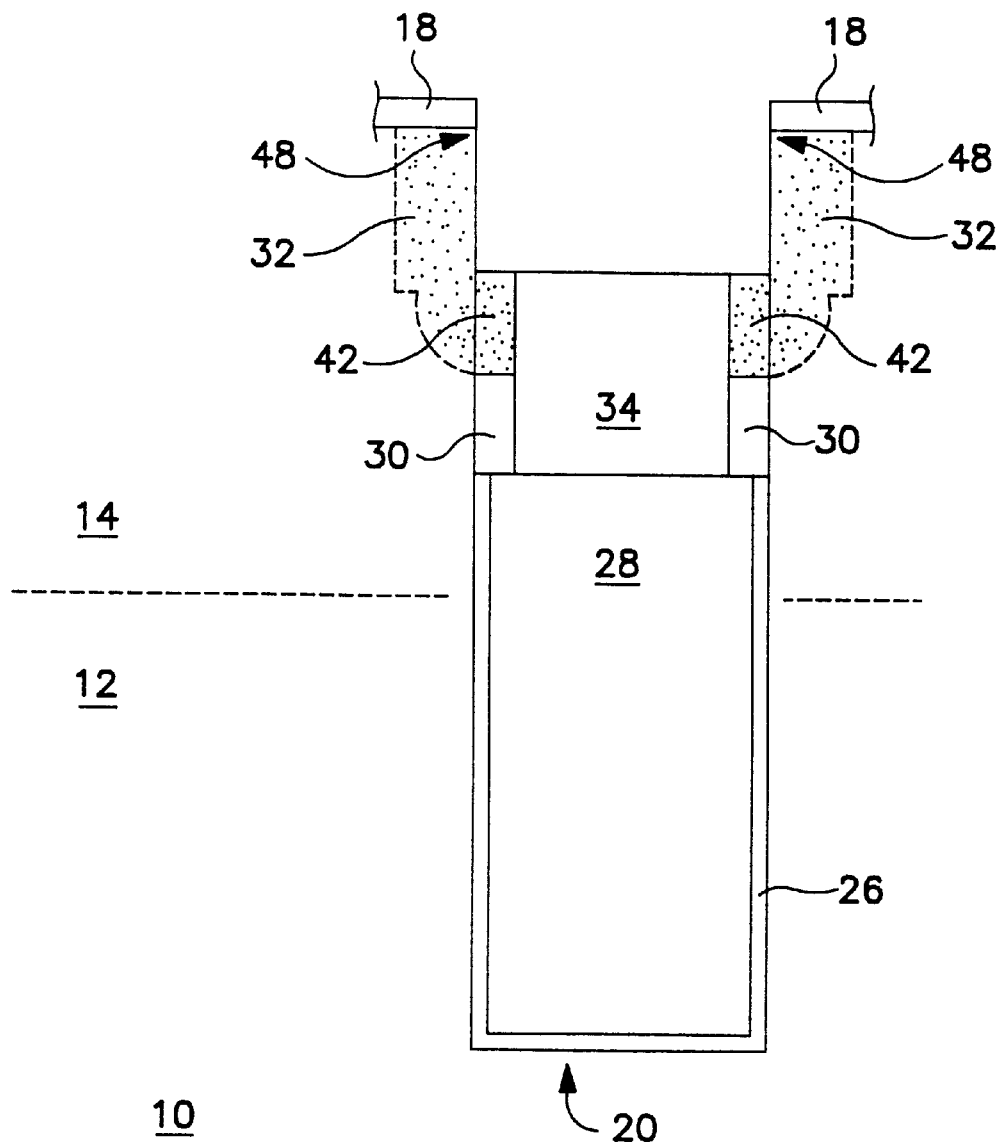
FIG. 1 shows a cross-sectional view of a trench capacitor cell formed by the method of the invention.

The invention will now be described by reference to the accompanying drawings. Throughout the specification, similar reference characters refer to similar elements in all figures of the drawings. In the drawings various aspects of the semiconductor device have been shown and schematically represented in a simplified manner to more clearly describe and illustrate the invention. For example, the top views and vertical cross-sections of the trench constructions have been illustrated as being rectangular in shape. However, those skilled in the art will appreciate that with practical semiconductor methods the actual formation of the trench and other aspects of the semiconductor device will most likely incorporate more rounded features. Moreover, the invention is not limited to constructions of any particular shape.

The semiconductor device formed by the method of the invention, an embodiment of which is shown in FIG. 1, may be formed in composite semiconductor substrate 10 having surface dielectric layer 18 and N⁻ layer 14 formed above P⁻ substrate region 12. The device has a trench capacitor comprising deep trench 20, having conductive material 28 and 34, thin film insulation layer 26, a partial collar of dielectric material 30, and doped region 32. Silicon substrate 10 has corner 48. Layer of diffusible material 42, which has been doped to form the buried conductive strap, extends from within deep trench 20 to N⁻ layer 14, thereby coupling conductive materials 34 and 28 with a later-formed transistor (not shown).

In the first step, a semiconductor substrate comprising a trench having a conductor separated from the walls of the trench by a dielectric material is provided. Although certain specific procedures for forming this semiconductor substrate are described herein, the invention is not limited by the procedure by which this substrate is provided.

Figure 2:
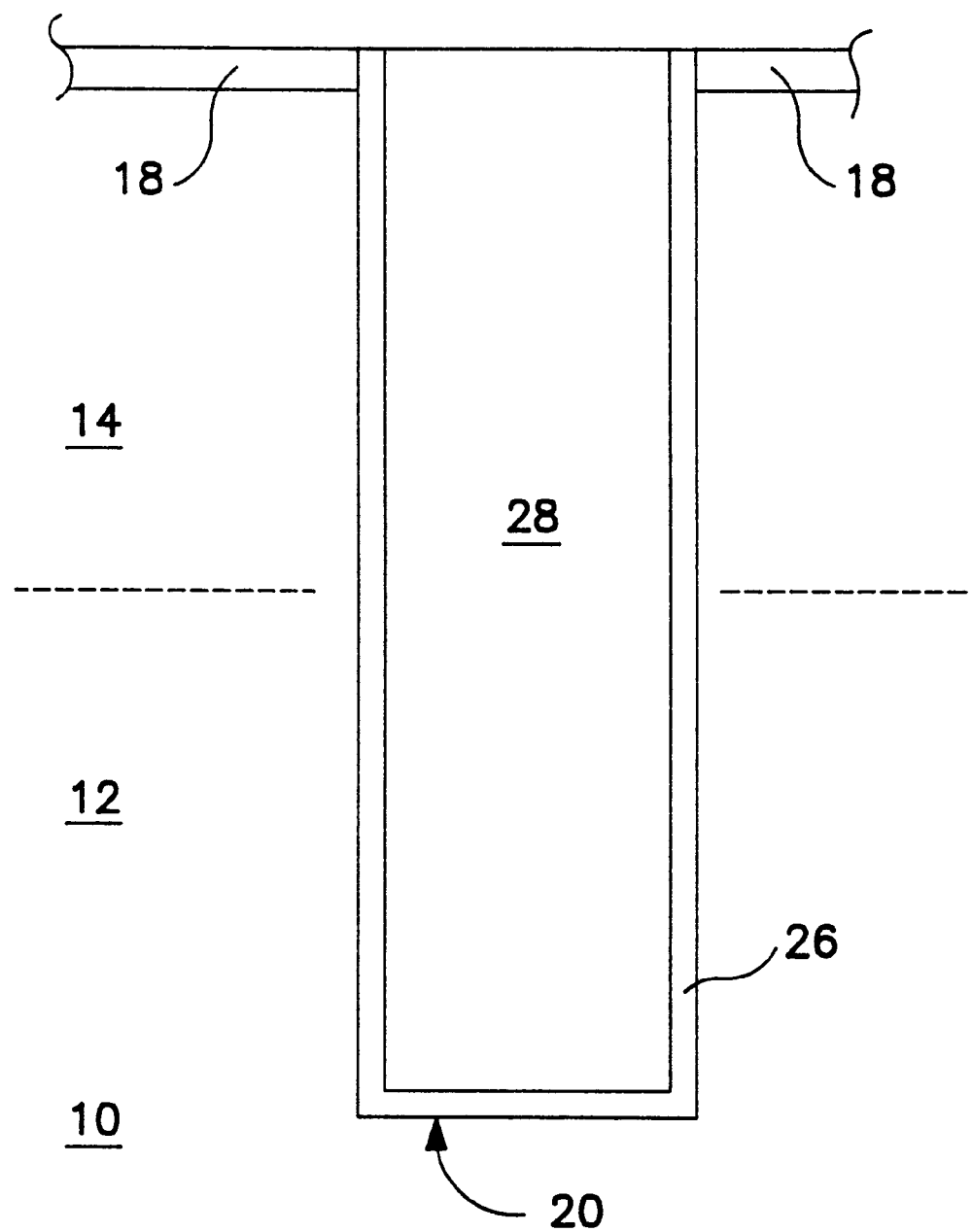
FIG. 2 shows a cross-sectional view of a cell structure comprising a trench having a conductor separated from the walls of the trench by a dielectric material.

Referring to FIG. 2, semiconductor substrate 10 has N⁻ layer 14 formed above P⁻ substrate region 12. As will be recognized by those skilled in the art, although the boundaries of N⁻ layer 14 within semiconductor substrate 10 are not shown, N⁻ layer 14 is typically an implant in semiconductor substrate 10. Surface dielectric layer 18 is present on substrate 10. Semiconductor substrate 10 comprises deep trench 20 which contains thin film insulation layer of dielectric material 26 and is filled with conductive material 28. Those skilled in the art will recognize that the positioning and configuration of the doped regions vary with the design of the semiconductor device and that alternate designs are encompassed by the invention.

The semiconductor substrate containing the deep trench can be formed by methods well known to those skilled in the art, such as are described in Lu, U.S. Pat. No. 4,688,063, and in Kenney, U.S. Pat. No. 4,801,988. Surface dielectric layer 18 may be formed conformably over the surface of semiconductor substrate 10. The dielectric layer may be formed by any one of several methods, such as oxidation growth or chemical vapor deposition. Although surface dielectric layer 18 is shown schematically as a single thin layer, it may comprise more than one layer. In one embodiment surface dielectric layer 18 comprises a composite of dielectric materials, such as a silicon oxide layer and a silicon nitride layer. Preferably surface dielectric layer 18 comprises a silicon oxide layer of about 10.0 nm (100 A) and a silicon nitride layer of about 200 nm (2000 A) over the silicon oxide layer.

A masking oxide layer (not shown) may be formed on top of surface dielectric layer 18 and patterned to allow deep trench 20 to be formed in the semiconductor substrate. The deep trench may be formed by methods well known in the art, such as reactive ion etching (RIE). In one embodiment the trench is about 8 microns deep and has an aspect ratio of about 20:1.

After deep trench 20 is formed, thin insulating layer 26 is formed along the trench sidewalls by methods well known to those skilled in the art, such as thermal oxide growth or chemical vapor deposition. Preferably thin insulating layer 26 has a thickness of 5 to 10 nm (50 to 100 A). Thin insulating layer 26 may comprise common dielectric materials, such as, silicon dioxide, silicon nitride, and, preferably, combinations thereof.

Deep trench 20 is filled with conductive material 28, such as a N⁺ doped polysilicon, which facilies the storage of a charge in the trench capacitor structure. Conductive material 28 may be planarized to form an even plane with surface dielectric layer 18. Planarization may be accomplished by means well known to those skilled in the art such as chemical mechanical polishing or reactive ion etching.

A portion of the dielectric material that forms thin insulating layer 26 and a portion of conductive material 28 are each removed from the top of deep trench 20 to a level below a top surface of the conductor to expose the upper portion of the trench sidewalls. Conductive material 28 may be removed by a non-directional etch, such as a plasma etch; the dielectric material that forms thin insulating layer 26 may be removed by a wet etch. The point at which removal is terminated defines the upper and lower trench sidewall portions. In a preferred embodiment, conductive material 28 would be left in about the lower 80% of deep trench 20.

Figure 3:
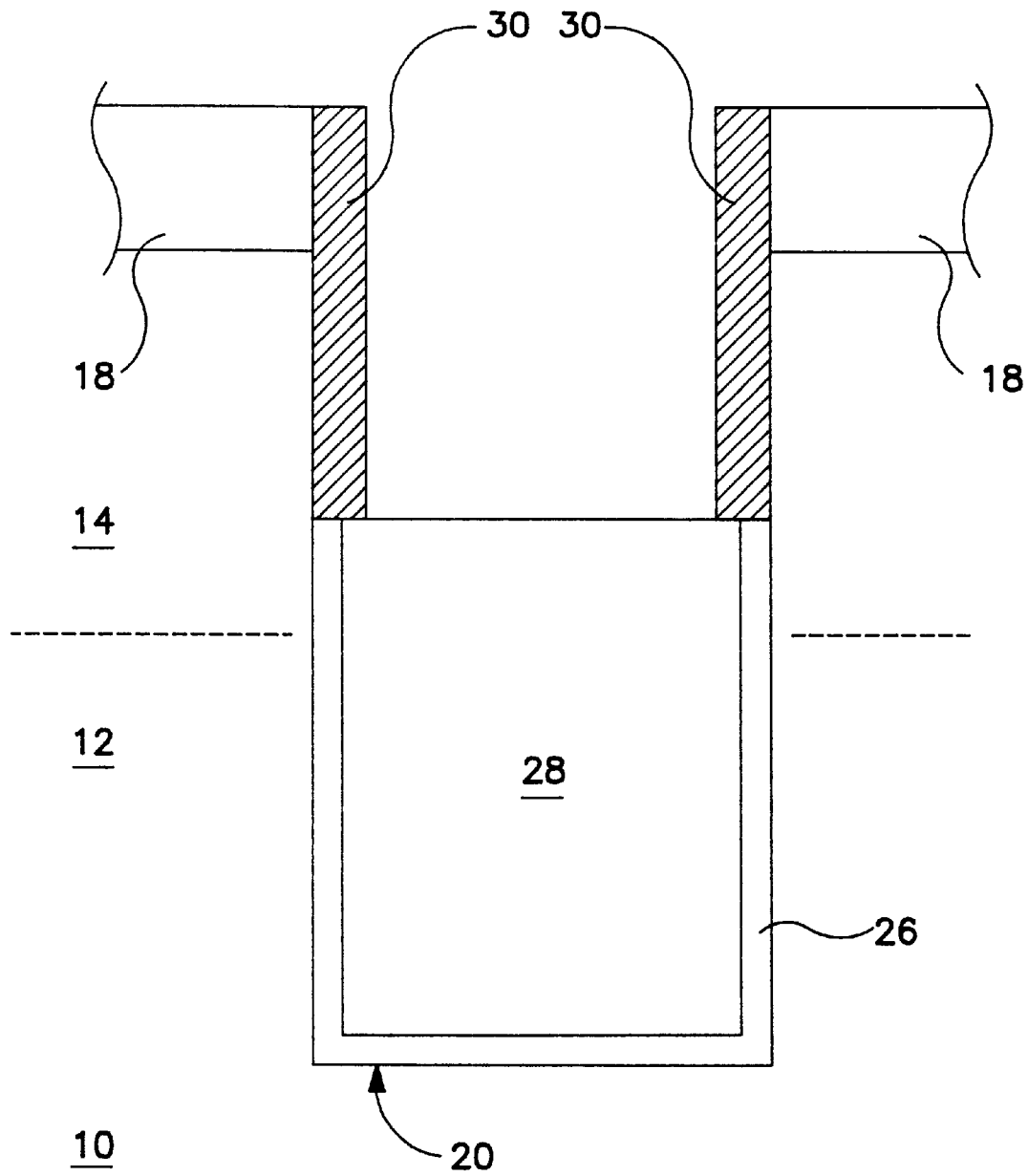
FIG. 3 shows a cross-sectional view of a cell structure in which a portion of the dielectric material and conductive material has been removed and a layer of dielectric material formed along the wall of the trench.

As shown in FIG. 3, after a portion of thin insulating layer 26 and conductive material 28 has been removed and the upper portions of the trench sidewalls exposed, a layer of dielectric material 30 is formed along the upper sidewall of the trench. Layer of dielectric material 30 may be formed by chemical vapor deposition, by thermal oxide growth, or by other means that allows a conformal layer of the dielectric material to be applied to the sidewalls. An anisotropic etch (e.g., reactive ion etching) may be applied to remove portions of the oxide without removing those portions formed on the sidewalls of the trench. Layer of dielectric material 30 may comprise a common dielectric, such as silicon dioxide. In a preferred embodiment, the layer of dielectric material 30 has a thickness of about 50 to 100 nm (500 to 1,000 A).

The upper portion of deep trench 20 is refilled with second layer of conductive material 34, such as an N⁺ doped polysilicon, deposited in the upper portion of deep trench 20 adjacent to newly formed layer of dielectric material 30. Conductive material 34 will typically be the same conductive material as conductive material 28.

Conductive material 34 is planarized by CMP first and then is etched to well below the surface of the trench. Conductive material 34 can be removed by a non-directional etch, such as a plasma etch. The resulting recess typically has a depth of about 100 nm (1000 A).

Figure 4:
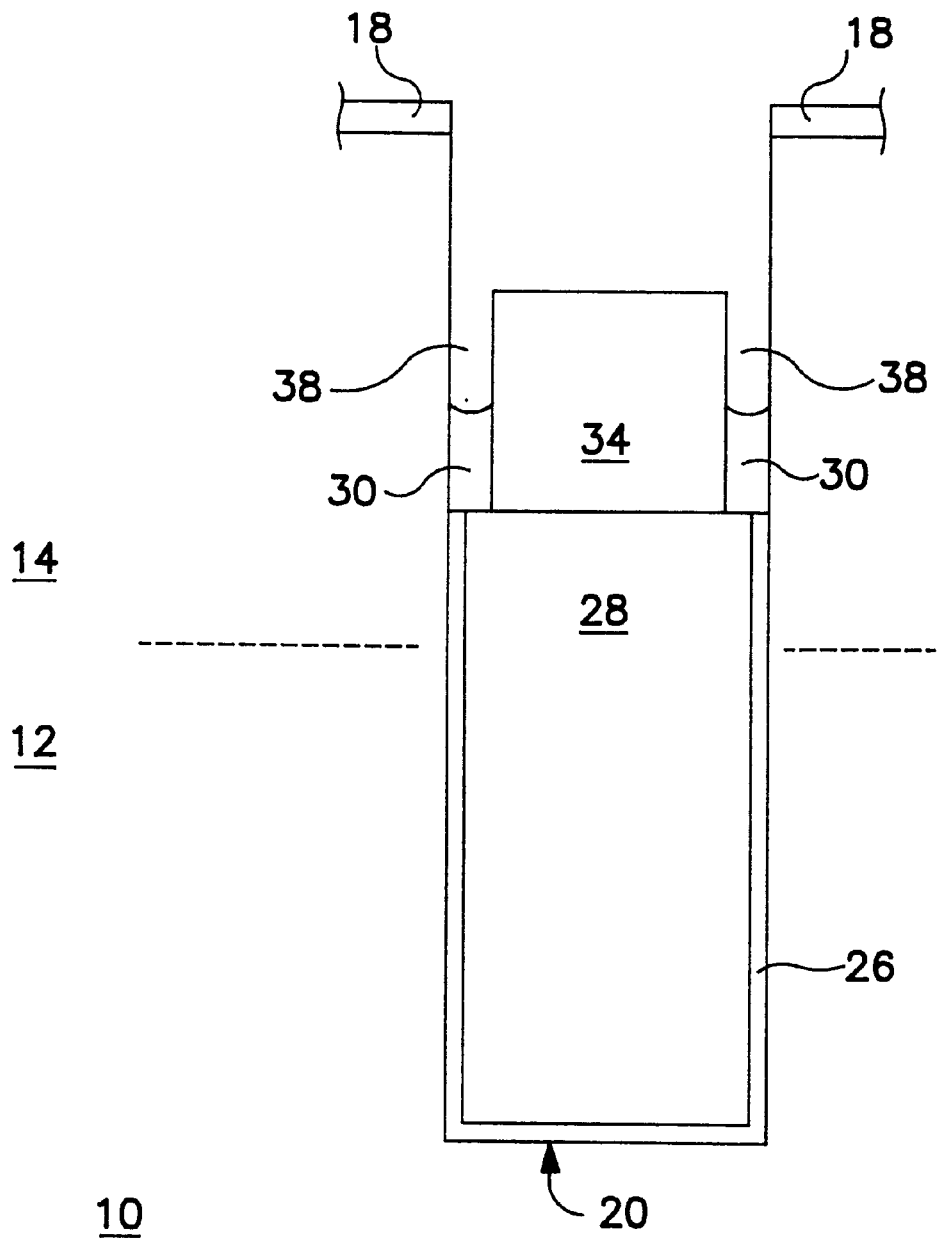
FIG. 4 shows a cross-sectional view of a cell structure in which the upper portion has been refilled with conductive material adjacent to a newly formed layer of dielectric material and the conductive material and dielectric material etched to below the surface of the substrate.

In the next step, a portion of dielectric material 30 is removed to a level below the top surface of the conductor, so that a partial collar of dielectric material remains. A portion of layer of dielectric material 30 is removed so that the collar of dielectric material is below top 36 of conductive material 34, thus forming well 38. Dielectric material 30 may be removed by a wet etch using dilute hydrofluoric acid. The buried strap will be formed in well 38. Well 38 typically has a depth of about 50 nm (500 A). A cross-section of the resulting structure is shown in FIG. 4.

Figure 5:
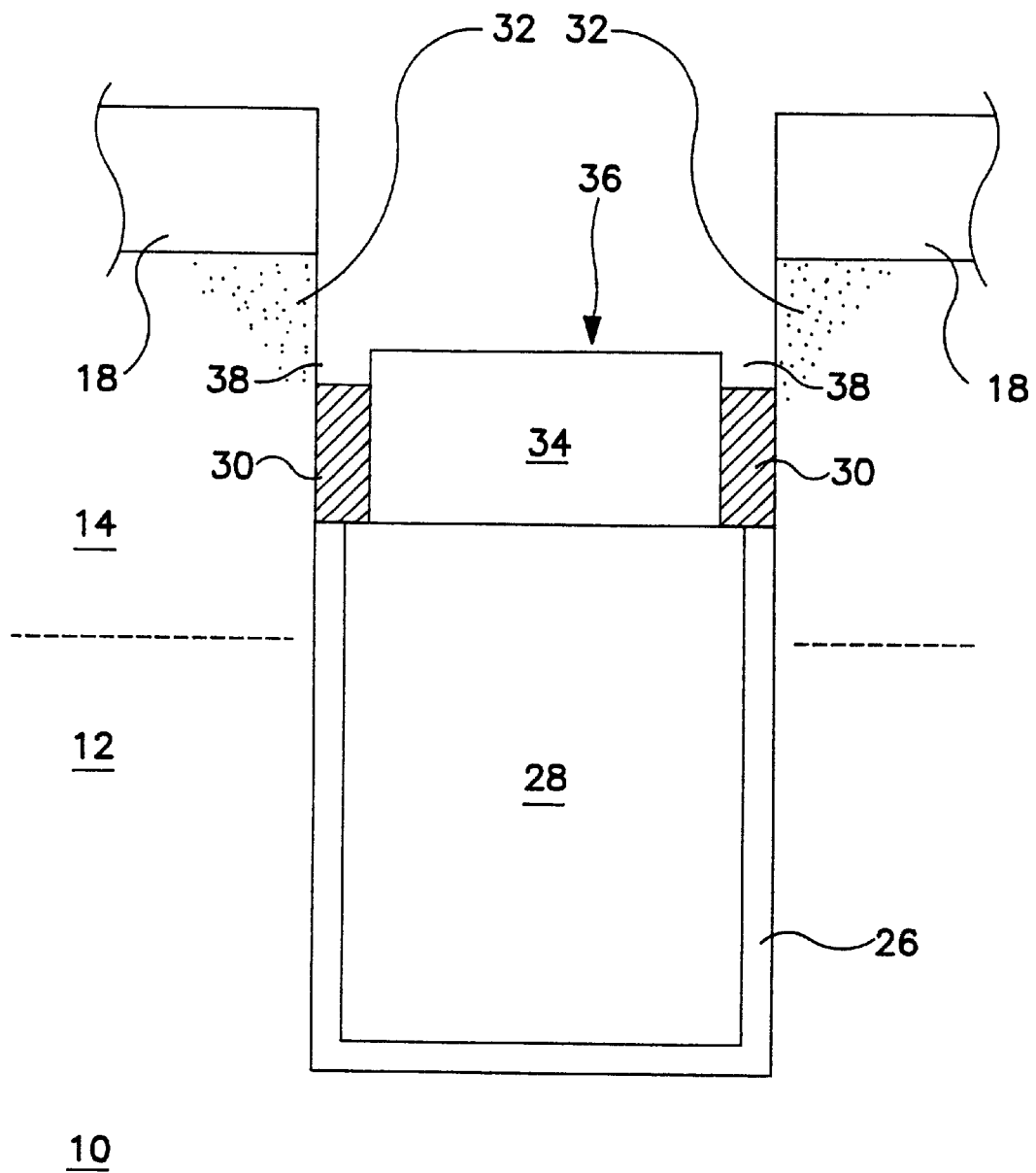
FIG. 5 shows a cross-sectional view of a cell structure in which a portion of the dielectric material has been removed to a level below the top surface of the conductor and the exposed sidewall implanted with conductive elements to produce a doped region.

Following removal of the dielectric material, an angled or vertical ion implant, such as an angled phosphorous ion implant, may be carried out to implant conductive elements into the exposed sidewalls. Doped region 32 is produced adjacent to the exposed sidewalls when the conductive elements are implanted in the sidewalls. A cross-section of the resulting structure is shown in FIG. 5.

Figure 6:
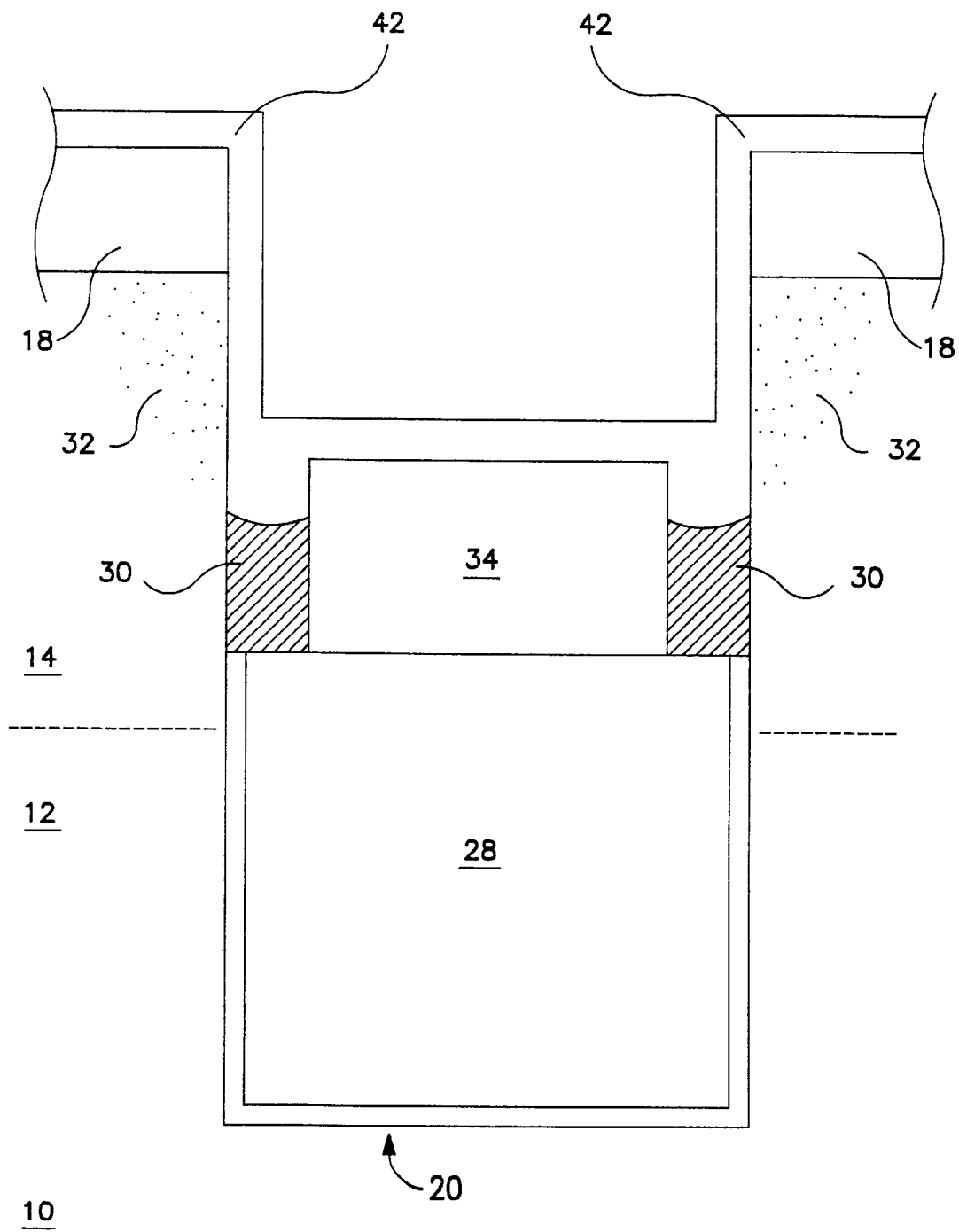
FIG. 6 shows a cross-sectional view of a cell structure in which a diffusible material has been deposited in at least a portion of the space formed by removal of the dielectric material.

In the next step, at least a portion of a space formed by the removing of the dielectric material is filled with a diffusible material, which will form the buried strap. Diffusible material 42 is deposited in well 38 so that at least a portion of well 38 is filled with the diffusible material. The preferred diffusible material is intrinsic polysilicon, which preferably has a thickness of about 25 nm (250 A). Intrinsic polysilicon may be deposited by methods well known to those skilled in the art, such as furnace deposition or physical vapor deposition (PVD). During this deposition intrinsic polysilicon is also deposited on the surface of dielectric layer 18, the sidewall, and on the surface of conductive material 34. A cross-section of the resulting structure is shown in FIG. 6.

In the next step, a conductive pathway is formed from a wall of the trench to the conductor. During this step, the conductor, the wall and the diffusible material are annealed the so that conductive elements from the wall and the conductor diffuse into the diffusible material. Annealing may be carried out by methods well known to those skilled in the art. During this step, conductive elements diffuse into diffusible material 42 to form a layer of conductive material, which comprises the buried conductive strap. Conductive elements also diffuse away from the sidewall into N⁻ layer 14, enlarging doped region 32.

After annealing, polysilicon layer 42 is removed from the surface of dielectric layer 18, the sidewall, and the surface of conductive material 34. Removal of polysilicon layer 42 with a directional etch, such as reactive ion etching with, for example, sulfur hexafluoride ($SF_6$), carbon tetrafluoride ($CF_4$), or chlorine ($Cl_2$), is preferred. If a directional etch is not used, corner 48, formed by the intersection of the top surface of silicon substrate 10 and the wall of the trench, may be etched away. It is also important to avoid overetching the polysilicon so that the buried conductive strap is not affected.

A cross-section of the resulting structure is shown in FIG. 1, which shows the semiconductor trench capacitor cell having a buried conductive strap formed by the method of the invention. If corner 48 is not etched away, the intersection of the top surface of silicon substrate 10 and the wall of the trench is about a right angle.

After the annealing step, during the etching process that removes the polysilicon from the surface of dielectric layer 18, the sidewall, and the surface of conductive material 34, corner 48 may be etched away if a directional etch is not used. In an alternate, FIG. 8 embodiment of the invention, a spacer, which protects corner 48 during etching, is formed on the sidewall of the trench exposed by removal of dielectric material 30. The spacer is formed after partial removal of dielectric material 30 shown in FIGS. 3 and 4, after the ion implant if an ion implant is carried out, but before deposition of diffusible material 42.

In this embodiment, only dielectric material 30 which extends above the top surface of conductive material 34 should be removed before the spacer is formed. After removal of the dielectric material the top surface of the remaining dielectric material will be at about the same level as the top surface of conductive material 34.

Figure 7:
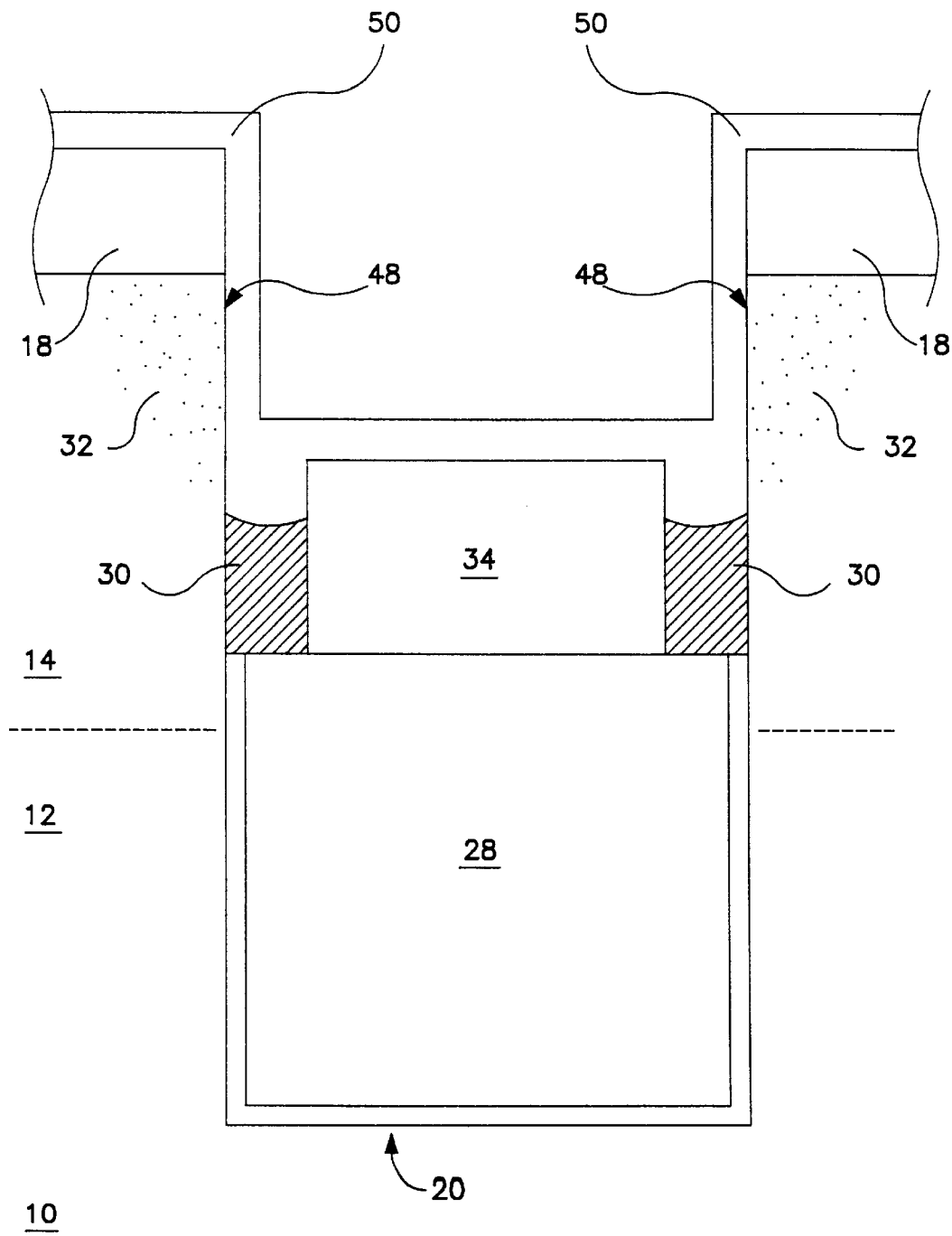
FIG. 7 shows a cross-sectional view of a cell structure formed in an alternate embodiment of the invention.

To form the spacer, a thin layer of silicon nitride 50, typically about 20–30 nm (200 to 300 A) thick, is deposited. The resulting structure is shown in FIG. 7.

Most of silicon nitride layer 50 is then etched away to leave spacer 52. Spacer 52 should extend to the top of surface dielectric layer 18. Silicon nitride layer 50 can be removed by reactive ion etching.

Figure 8:
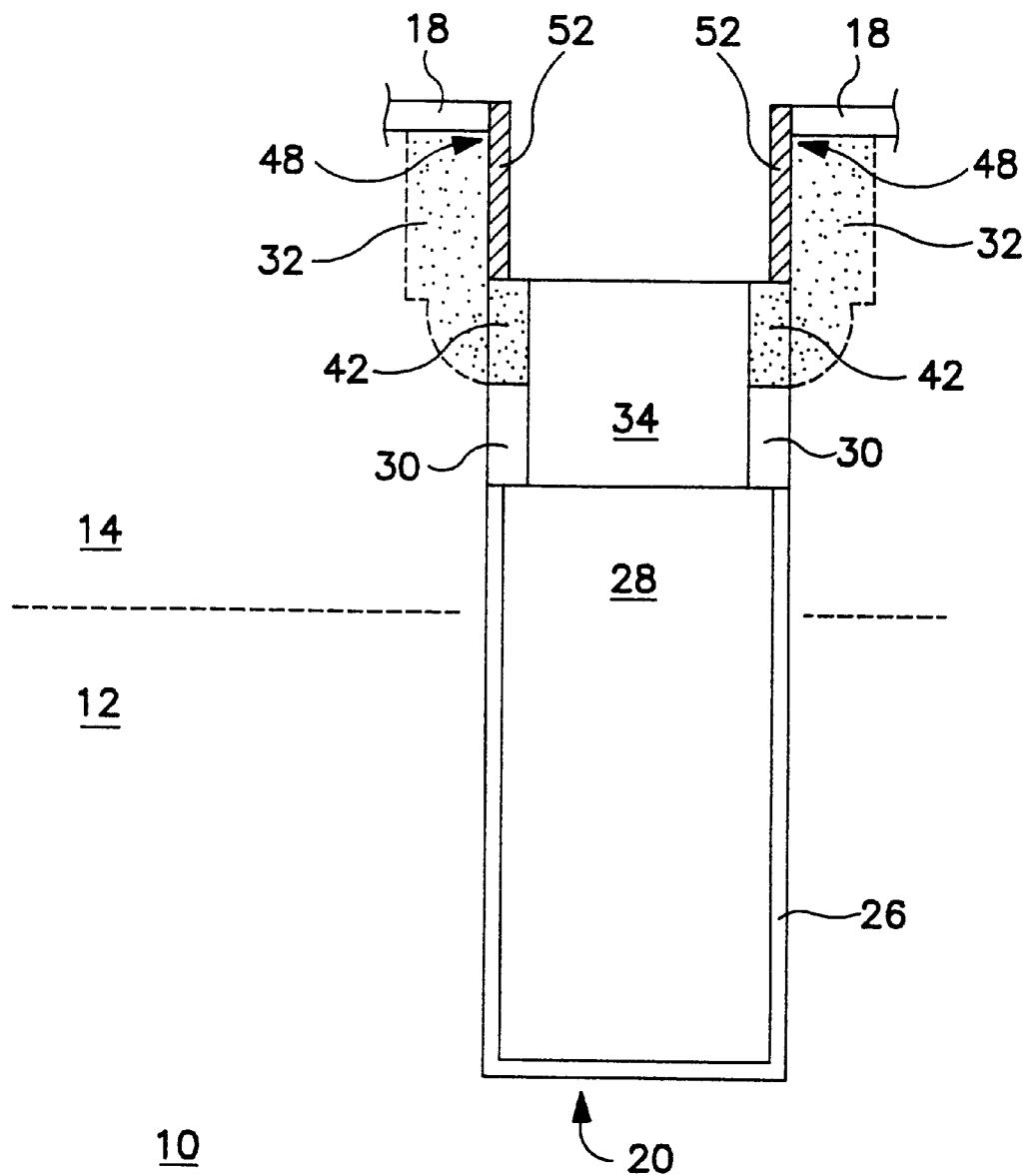
FIG. 8 shows a cross-sectional view of a trench capacitor cell formed in an alternate embodiment of the invention in which a spacer has been formed to protect the corner of the substrate.

Additional dielectric material 30 is removed to form well 38. Well 38 is filled with diffusible material 42 as described above. Then, as described above, the wall and the diffusible material are annealed to form the conductive pathway and polysilicon removed from the surface of dielectric layer 18, the sidewall, and the surface of conductive material 34. Formation of the buried strap is then completed as described above. The resulting structure is shown in FIG. 8, which shows a cross-sectional view of a trench capacitor cell formed in the alternate embodiment of the invention. Because corner 48 is protected during etching and is not etched away, the intersection of the top surface of silicon substrate 10 and the wall of the trench is about a right angle.

The trench capacitor cell having a buried strap formed by the method of the invention is useful in the formation of dynamic random access memory cells. These cells are used in semiconductor devices, particularly integrated circuit dynamic random access memories (DRAMs).

Having described the invention, we now claim the following and their equivalents.

What is claimed is:

1. A method comprising:
   (a) providing a substrate comprising a trench having a conductor separated from walls of the trench by a dielectric material;
   (b) removing a portion of the dielectric material to a level below a top surface of the conductor;
   (c) filling at least a portion of a space formed by the removing of the dielectric material with a diffusible material; and
   (d) forming a conductive pathway from a wall of the trench to the conductor including annealing the conductor, the wall and the diffusible material so that conductive elements from the wall and the conductor diffuse into the diffusible material.

2. The method of claim 1 further comprising, after step (b) and before step (c):
   implanting conductive elements into the wall of the trench exposed by removing the dielectric material.

3. The method of claim 1 further comprising, after step (a):
   depositing a layer of nitride on the wall of the trench.

4. The method of claim 1 in which the diffusible material is intrinsic polysilicon.

5. The method of claim 1 additionally comprising, after step (d), removing diffusible material from the conductor with a directional etch.

6. A method comprising:
   (a) providing two conductors having vertical sidewalls separated by a dielectric material;
   (b) removing a portion of the dielectric material;
   (c) filling at least a portion of a space formed by the removing of the dielectric material with a diffusible material; and
   (d) forming a conductive pathway from one of the conductors to the other conductor including annealing the conductors and the diffusible material so that conductive elements from the conductors diffuse into the diffusible material.

7. The method of claim 6 further comprising, after step (b) and before step (c):
   implanting conductive elements into at least a portion of the sidewalls exposed by removing the dielectric material.

8. The method of claim 6 further comprising, after step (a):
   depositing a layer of nitride on the sidewalls exposed by removing the dielectric material.

9. The method of claim 6 in which the diffusible material is intrinsic polysilicon.

10. A method comprising:
    (a) providing two conductors having vertical sidewalls separated by a dielectric material;
    (b) removing a portion of the dielectric material;
    (c) implanting conductive elements into at least a portion of the vertical sidewalls exposed by removing the dielectric material;
    (d) depositing a layer of nitride on vertical sidewalls exposed by removing the dielectric material down to the dielectric material;
    (e) filling at least a portion of a space formed by the removing of the dielectric material with a diffusible material; and
    (f) forming a conductive pathway from one of the conductors to the other conductor including annealing the conductors and the diffusible material so that conductive elements diffuse into the diffusible material.

11. The method of claim 10 in which the diffusible material is intrinsic polysilicon.

* * * * *

UNITED STATES PATENT AND TRADEMARK OFFICE
CERTIFICATE OF CORRECTION

PATENT NO. : 6,040,213
DATED : March 21, 2000
INVENTOR(S) : Canale et al.

Page 1 of 1

It is certified that error appears in the above-identified patent and that said Letters Patent is hereby corrected as shown below:

Title page,
Under item [56], References Cited U.S. PATENT DOCUMENTS, please insert:

| | | | |
|---|---|---|---|
| 4,801,988 | 1/31/89 | Kenney | 357/23.6 |
| 5,360,758 | 11/1/94 | Bronner et al. | 437/52 |
| 5,363,327 | 11/8/94 | Henkles et al. | 365/149 |
| 5,545,583 | 8/13/96 | Lam et al. | 437/52 |
| 5,576,566 | 11/19/96 | Kenney | 257/301 |
| 5,614,431 | 3/25/97 | DeBrosse | 437/52 |

Signed and Sealed this

Twenty-third Day of October, 2001

Attest:

*Attesting Officer*

NICHOLAS P. GODICI
*Acting Director of the United States Patent and Trademark Office*